United States Patent [19]

Goodman et al.

[11] 4,344,985
[45] Aug. 17, 1982

[54] METHOD OF PASSIVATING A SEMICONDUCTOR DEVICE WITH A MULTI-LAYER PASSIVANT SYSTEM BY THERMALLY GROWING A LAYER OF OXIDE ON AN OXYGEN DOPED POLYCRYSTALLINE SILICON LAYER

[75] Inventors: Alvin M. Goodman, Princeton; Ming L. Tarng, Mercerville, both of N.J.

[73] Assignee: RCA Corporation, New York, N.Y.

[21] Appl. No.: 248,208

[22] Filed: Mar. 27, 1981

[51] Int. Cl.³ .......................................... H01L 21/316
[52] U.S. Cl. ....................................... 427/85; 357/54; 427/93; 427/95
[58] Field of Search ................ 427/93, 95, 85; 357/54

[56] References Cited

U.S. PATENT DOCUMENTS

| | | | |
|---|---|---|---|
| 3,911,168 | 10/1975 | Schinella et al. | 427/93 |
| 3,971,061 | 7/1976 | Matsushita et al. | 357/52 |
| 3,977,019 | 8/1976 | Matsushita | 357/48 |
| 4,014,037 | 3/1977 | Matsushita et al. | 357/52 |
| 4,063,275 | 12/1977 | Matsushita et al. | 357/54 |
| 4,194,934 | 3/1980 | Blaske | 427/93 |

FOREIGN PATENT DOCUMENTS 1552759 9/1979 United Kingdom .
1552760 9/1979 United Kingdom .

OTHER PUBLICATIONS

Abbas et al., "High Resistivity Poly-Oxide", IBM TDB, vol. 19, No. 11, Apr. 1977, p. 4154.
Doping Polysilicon Layer with Oxygen Neutralizes Device Surface Charges, Electronics International, Jun. 26, 1975, p. 53.

Primary Examiner—John D. Smith
Attorney, Agent, or Firm—Birgit E. Morris; Donald S. Cohen; Robert P. Seitter

[57] ABSTRACT

There is disclosed a method of forming a multi-layer passivant system including a layer of oxygen doped polycrystalline silicon over the semiconductor substrate. A layer of silicon dioxide is thermally grown over the oxygen doped polycrystalline silicon layer. If desired, layers of glass and an additional oxide layer can be formed over the thermally grown oxide.

8 Claims, 1 Drawing Figure

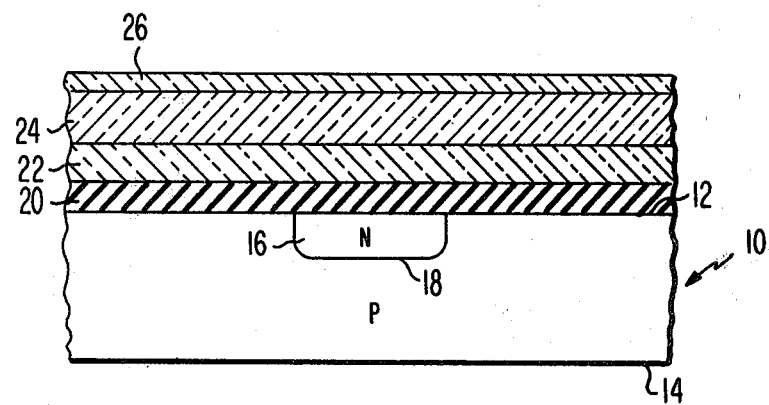

METHOD OF PASSIVATING A SEMICONDUCTOR DEVICE WITH A MULTI-LAYER PASSIVANT SYSTEM BY THERMALLY GROWING A LAYER OF OXIDE ON AN OXYGEN DOPED POLYCRYSTALLINE SILICON LAYER

BACKGROUND OF THE INVENTION

This invention relates to a method of passivating a semiconductor junction, and, more particularly, to such a method using a multi-layer passivant system.

A recently utilized passivant system for semiconductor junctions includes an oxygen doped polycrystalline silicon layer applied either directly on the semiconductor surface or over an oxide layer on the semiconductor surface. Over this polycrystalline layer there is applied an oxide layer, usually silicon dioxide ($SiO_2$). For high voltage semiconductor devices, the passivant system may further include a thick glass layer over the oxide and yet another oxide layer over the glass.

The above described multi-layer passivant systems are highly effective, but are relatively expensive to utilize as can be seen from the following brief description of a most usual method of depositing the various layers on the semiconductor device. In accordance with the most usual technique, the oxygen doped polycrystalline silicon is deposited in a chemical vapor deposition (CVD) process wherein the wafer is placed in a CVD reactor which is heated to a temperature of between about 600° C. and about 750° C. Silane ($SiH_4$) and nitrous oxide ($N_2O$) are then fed into the reactor in a suitable ratio (preferably from about 0.2 to about 0.4) and the silane and nitrous oxide react on the hot semiconductor surface to form a layer of polycrystalline silicon uniformly doped with oxygen atoms. Next, the oxide layer is deposited on the oxygen doped polycrystalline silicon layer by a low temperature CVD process. In carrying out this process, the wafer is placed in another CVD reactor in which the temperature is maintained at about 400° C. to about 600° C. and silane and oxygen are now fed into this reactor. The silane and oxygen react to deposit a layer of silicon dioxide over the surface of the polycrystalline silicon. Thereafter, the silicon dioxide is annealed at a temperature of about 900° C. in a nitrogen atmosphere. Any additional layers to be deposited over the oxide are provided in accordance with generally conventional techniques. The numerous steps required to form the oxide layer over the polycrystalline silicon layer add significantly to the cost of the system.

SUMMARY OF THE INVENTION

This invention provides a relatively inexpensive method of making a multi-layer passivant system including oxygen doped polycrystalline silicon and silicon dioxide. In accordance with this invention a semiconductor wafer including a PN junction is passivated by depositing a layer of oxygen doped polycrystalline silicon over the substrate and then thermally growing a layer of silicon dioxide on the polycrystalline silicon layer.

Preferably, the oxygen doped polycrystalline silicon layer is deposited in a CVD reactor. Thereafter, the temperature in the reactor is raised to about 900° C. and steam is fed into the chamber to grow the oxide layer.

BRIEF DESCRIPTION OF THE FIGURE

For a better understanding of the invention, reference is made to the following description of a preferred embodiment thereof taken in conjunction with the FIGURE of the accompanying drawing which is a section view of a semiconductor device passivated by a multi-layer system in accordance with this invention.

DETAILED DESCRIPTION OF A PREFERRED EMBODIMENT

Referring now to the drawing, there is illustrated a semiconductor wafer 10 including a pair of parallel major surfaces 12 and 14. The semiconductor wafer 10 can be any conventional semiconductor material with the use of silicon being preferred. The wafer 10 can be suitably doped with impurity atoms of any type in any desired concentration. In the drawing, the wafer 10 is doped with P type atoms. Extending into the wafer from the surface 12 is a region 16 of opposite doping, in this example with N type doping, to form a PN junction 18. The region 16 can be formed in accordance with conventional techniques, for example, by conventional diffusion techniques. It should be understood that in the usual semiconductor wafer, a plurality of devices are manufactured and, accordingly, there will normally be a plurality of regions 16 and junctions 18 in a single wafer. After fabrication, the devices are separated from each other. For the sake of clarity, only a single junction is illustrated.

To passivate the junction 18, a multi-layer passivant system is formed over the surface 12. It should be understood, that the semiconductor device being fabricated could include mesas or moats and that the multi-layer passivant system could be deposited on these surface configurations.

The multi-passivant system includes an oxygen doped polycrystalline silicon layer 20 deposited over the surface 12 and a silicon dioxide layer 22 on the outermost surface of the layer 20. If desired, a thick fused frit-glass layer 24 is applied over the oxide layer 22 and an additional silicon dioxide layer 26 is applied over the glass layer. Such a system is used to passivate the junctions of relatively high voltage devices, for example, devices subjected to 1,000 volts or more. It has been found preferable to form the oxygen doped polycrystalline layer 20 with a thickness of about 4,000 Angstroms; the oxide layer 22 with a thickness of about 4,000 Angstroms, the glass layer 24 with a thickness of about 5 to 100 microns; and, the outermost oxide layer 26 with a thickness of about 0.2 microns.

One method of forming the oxygen doped polycrystalline silicon layer 20 involves the use of a chemical vapor deposition (CVD) process carried out at about atmospheric pressure. With such a process, the wafer 10 is placed in a CVD reactor and the temperature in the reactor is raised to a temperature within the range of about 450° C. to about 800° C. with a preferred temperature being about 670° C. At this elevated temperature, nitrous oxide ($N_2O$) and silane ($SiH_4$) are fed into the reactor chamber in a ratio determined by the desired resistivity of the layer 20. It has been found that a ratio of nitrous oxide to silane of about 0.2 to about 0.3 is preferred for most purposes. At the elevated temperature, the nitrous oxide and silane react on the hot surface of the wafer and form a layer of polycrystalline silicon uniformly doped with oxygen atoms. The usual doping concentration of oxygen atoms to polycrystalline silicon atoms is in the range of about 2% to 45% with 15% to 35% being preferred.

After depositing the layer 20, it is usually annealed, that is, heated to a temperature on the order of about 900° C. for about 30 minutes. This annealing step insures a reliable bond between the silicon and oxygen atoms and otherwise stabilizes the material.

In accordance with this invention, instead of using a low temperature oxide growth technique to deposit the oxide layer 22 on the oxygen doped polycrystalline silicon layer 20, a thermal growth technique is utilized and, conveniently, can be done while annealing the polycrystalline silicon layer 20. This is accomplished by admitting steam mixed with about 1% to about 10% hydrochloric acid (HCl) into the CVD reactor while annealing the layer 20 at 900° C. for about one hour and fifteen minutes. The addition of the hydrochloric acid enhances the stability and reliability of the oxide layer and also increases its growth rate. Other suitable oxidizing atmospheres can, of course, be utilized. The initial thickness of the oxygen doped polycrystalline silicon layer 20 is about 8,000 Angstroms. During the combination anneal and oxide growth step, the outermost 2,000 Angstroms of the oxygen doped polycrystalline silicon layer 20 is converted to 4,000 Angstroms of silicon dioxide. Other oxidizing agents can, of course, be used and the time and temperatures would vary. The thickness of the thermally grown oxide layer should be at least about 2,000 Angstroms.

In addition to eliminating the low temperature oxide growth step by thermally growing oxide during the annealing step, other advantages are realized. The thermal oxide layer 22 need not be annealed as is required when depositing this layer by low temperature oxide techniques. Thus, this second annealing step is eliminated. Moreover, the thermal growth technique results in a layer of more uniform thickness than does the low temperature oxide growth technique. This is particularly important when moats or mesas are to be passivated. With such configurations, an oxide layer grown by low temperature growth techniques may not adhere to the intersection of the planar surface and the walls of the moat or mesa or may be relatively thin at these locations. A thermally grown oxide layer will be uniformly formed at these locations.

The frit-glass layer 24 can comprise, by weight, about 50% lead or zinc oxide, about 40% silicon dioxide and about 10% aluminum oxide. It can be applied in the form of a powder which is initially suspended in a binder medium such as alcohol, a chlorinated organic solvent, or the like to form a slurry. The slurry is applied over the outermost surface of the oxide layer 22 by doctor-blading, or spinning, or the like. After the slurry is applied, the wafer 10 is heated to evaporate or burn off the binder medium. In the case where the binder medium is alcohol the wafer 10 is heated to a temperature of about 640° C. for a period of about 30 minutes in an ambient of air.

The wafer 10 is then heated to a fusing temperature at which the slurry becomes fluid and flowable. For the glass composition described above, the wafer 10 is heated to a temperature between from about 700° C. to about 1,000° C. and is maintained at that temperature for about 10 to about 15 minutes. Upon cooling, the glass layer 24 forms a bond with the silicon of the oxide layer 22.

The oxide layer 26 can be formed by conventional methods, such as, by reacting oxygen with silane at a temperature of about 400° C. After this layer is formed, it can be annealed by heating the wafer 10 to a temperature of about 900° C. for about 30 minutes.

As can be seen from the foregoing, there is disclosed a relatively inexpensive method of forming a multi-passivant system including oxygen doped polycrystalline silicon and an oxide layer thereover. Moreover, it can be seen that adhesion of the oxide is improved at critical locations. It should be obvious to those skilled in the art that various changes and modifications can be made without departing from the true spirit and scope of the invention as recited in the appended claims.

We claim:

1. A method of forming a multi-layer passivation system on the surface of a semiconductor substrate, said method comprising:
   depositing an oxygen doped polycrystalline silicon layer on the surface of the substrate; and
   thermally growing a layer of oxide on the exposed surface of the oxygen doped polycrystalline silicon layer, the oxide layer extending partially into the thickness of the oxygen doped polycrystalline silicon layer, while simultaneously annealing the polycrystalline silicon layer.

2. A method in accordance with claim 1 wherein said oxygen doped polycrystalline silicon layer is deposited by heating the substrate to a temperature within a range of about 450° C. to about 800° C. and exposing said wafer to a mixture of nitrous oxide and silane.

3. A method in accordance with claims 1 or 2 wherein the oxide layer is grown by raising the temperature of the wafer to at least about 900° C. and exposing the wafer to an oxidizing atmosphere.

4. A method in accordance with claim 3 wherein the oxidizing atmosphere is steam.

5. A method in accordance with claim 1 wherein a relatively thick glass layer is deposited over the thermally grown oxide layer.

6. A method in accordance with claim 5 wherein an oxide layer is formed over the glass.

7. A method in accordance with claim 1 wherein the oxide layer is grown to a thickness of at least about 2,000 Angstroms.

8. A method in accordance with claim 1 wherein the oxide layer is grown to a thickness of about 4,000 Angstroms.

* * * * *